United States Patent [19]

Vahala et al.

[11] Patent Number: 5,056,100
[45] Date of Patent: Oct. 8, 1991

[54] SEMICONDUCTOR LASER WITH PHOTON GAIN LEVER

[75] Inventors: Kerry J. Vahala, San Gabriel; Michael A. Newkirk, Pasadena, both of Calif.

[73] Assignee: California Institute of Technology, Pasadena, Calif.

[21] Appl. No.: 513,099

[22] Filed: Apr. 19, 1990

[51] Int. Cl.$^5$ .............................................. H01S 3/19
[52] U.S. Cl. ........................................ 372/50; 372/8; 372/26
[58] Field of Search .................... 372/44, 45, 50, 8, 26

[56] References Cited

U.S. PATENT DOCUMENTS

| | | | |
|---|---|---|---|
| 4,555,785 | 11/1985 | Scifres et al. | 372/8 |
| 4,748,630 | 5/1988 | Nagashima | 372/8 |
| 4,802,175 | 1/1989 | Suzuki | 372/8 |
| 4,910,571 | 3/1990 | Kasahara et al. | 372/8 |

OTHER PUBLICATIONS

Levi, Nottenburg, Nordin, Tanbun-Ek & Logan, "Multi-Electrode Quantum Well Laser for Digital Switching", Appl. Phys. Lett., 56, (12), Mar. 19, 1990, pp. 1095–1097.
N. Moore and K. Y. Lau, "Ultrahigh Efficiency Microwave Signal Transmission Using Tandem-Contact Single Quantum Well GaAlAs Lasers", Appl. Phys. Lett., 55 (10), 936, Sep. 4, 1989.
Kerry J. Vahala and Michael A. Newkirk, "Parasitic-Free Modulation of Semiconductor Lasers", IEEE Journal of Electronics, vol. 25, No. 6, Jun. 1989.
K. J. Vahala, M. A. Newkirk & T. R. Chen, "The Optical Gain Lever: A Novel Gain Mechanism in the Direct Modulation of Single Quantum Well Semiconductor Lasers", Appl. Phys. Lett., 54 (25), Jun. 19, 1989, pp. 2506–2508.
M. A. Newkirk, Kerry J. Vahala, T. R. Chen, Amnon Yariv, "Novel Gain Mechanism in an Optically Modulated Single Quantum Well Semiconductor Laser", CLEO '89/QELS '89/Wednesday Afternoon Joint/218, Apr. 26, 1989.
Kerry J. Vahala, "Quantum Box Fabrication Tolerance and Size Limits in Semiconductors and Their Effect on Optical Gain", IEEE Journal of Quantum Electronics, vol. 24, No. 3, Mar. 1988.
G. P. Agrawal, "Coupled-Cavity Semiconductor Lasers Under Current Modulation: Small-Signal Analysis", IEEE Journal of Quantum Elect., vol. QE-21, No. 3, Mar. 1985, pp. 255–263.
C. S. Harder, "Bistability, High Speed Modulation, Noise & Pulsations in GaAlAs Semiconductor Lasers", Thesis, Calif. Inst. of Tech., May 25, 1983.

Primary Examiner—James W. Davie
Attorney, Agent, or Firm—Norman E. Brunell

[57] ABSTRACT

A controllable semiconductor laser system including a plurality of semiconductor regions operated at unequal saturation photon densities to permit optical and/or electrical control of lasing in at least one resonant cavity formed therebetween. A pair of such regions may operate as a controllable laser at greater than 100% differential quantum efficiency.

42 Claims, 4 Drawing Sheets

SEMICONDUCTOR LASER WITH PHOTON GAIN LEVER

BACKGROUND OF THE INVENTION

1. Field of the Invention

This invention relates to semiconductor lasers and in particular to techniques for controlling the light output of such devices.

2. Description of the Prior Art

Semiconductor lasers may be made highly intrinsically efficient at low frequencies, but the minimum input power required to control them is still high enough to require drivers between the semiconductor lasers and low power input sources, such as logic circuitry. At higher frequencies, the problem is compounded by the lower intrinsic efficiency available with conventional designs. High frequency, or high bit rate, systems using conventional semiconductor lasers require preamplifying stages between the source of the control signal and the lasing device.

Similarly, control of semiconductor lasers by optical input signals conventionally requires several stages of conversion, from optical to electrical to more powerful optical signals.

The additional circuitry, power and physical requirements resulting from these difficulties limits the level of complex signal handling conveniently achievable with conventional semiconductor laser devices. What are needed are techniques and devices for generating and controlling emitted light from semiconductor lasers which obviate the need for additional levels of amplification, preamplification and/or conversion of electrical and/or optical input signals. In particular what are needed are semiconductor laser devices capable of more than 100% differential quantum efficiency, that is, of directly controlling an optical output signal with an optical or electrical input signal of lower energy.

SUMMARY OF THE INVENTION

The preceding and other shortcomings of the prior art are addressed and overcome by the present invention that provides a controllable semiconductor laser system including a plurality of semiconductor regions forming at least one resonant cavity and means for controlling lasing in the resonant cavity in response to optical and/or electrical input signals by operating at least two such semiconductor regions at unequal saturation photon densities.

In another aspect, the invention provides a method for controlling a semiconductor laser system by forming at least one resonant cavity with a plurality of semiconductor regions, and operating at least two semiconductor regions related thereto at unequal saturation photon densities.

These and other features and advantages of this invention will become further apparent from the detailed description that follows which is accompanied by one or more drawing figures. In the figures and description, numerals indicate the various features of the invention, like numerals referring to like features throughout both the drawing figures and the description.

DETAILED DESCRIPTION OF THE PREFERRED EMBODIMENT

Figure 1:
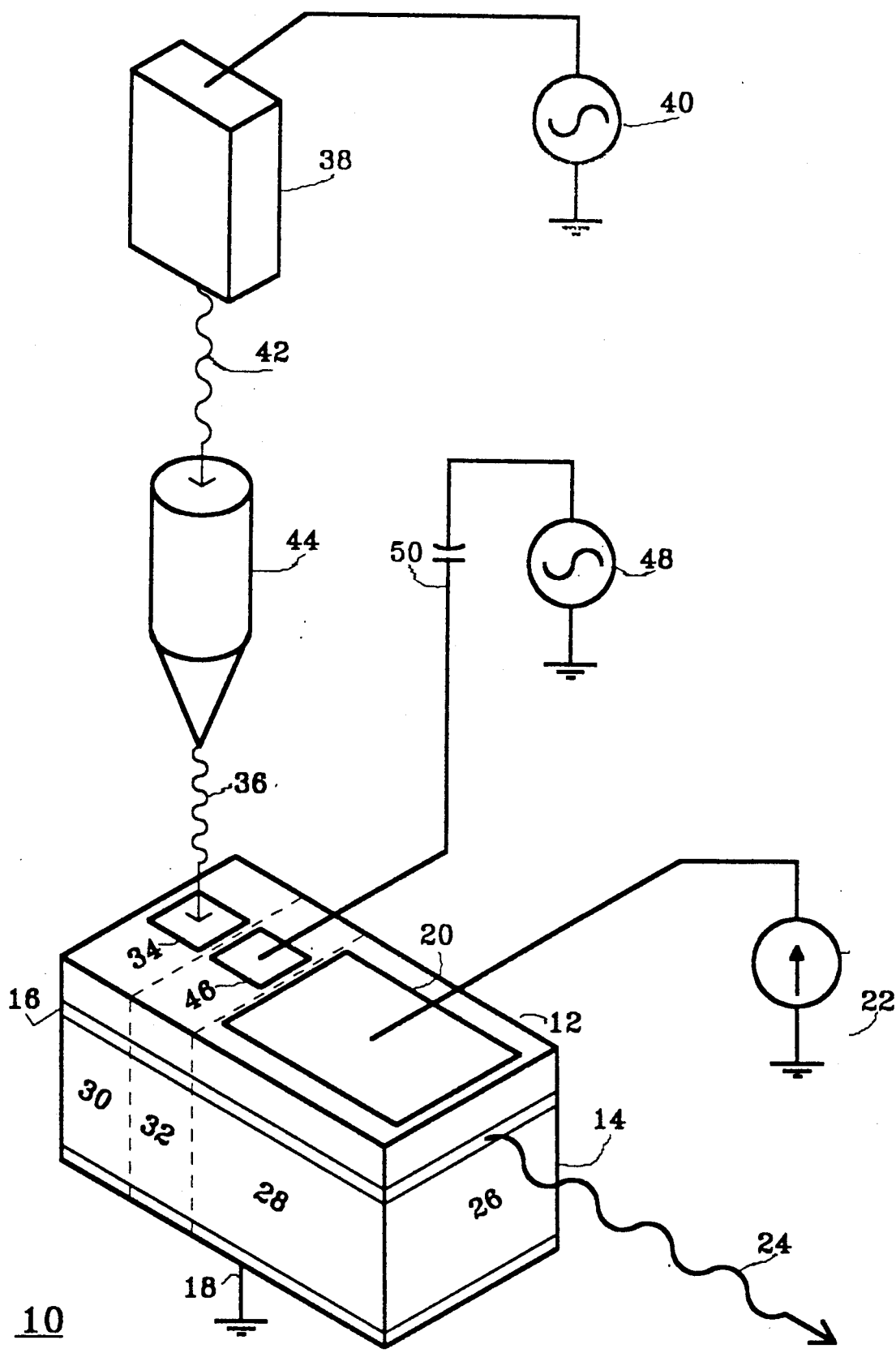
FIG. 1 shows semiconductor laser 10 constructed in accordance with the present invention, including both electrical and optical inputs for controlling the laser output.

FIG. 1 shows semiconductor laser 10 constructed in accordance with the present invention, including both electrical and optical inputs for controlling the laser output. Semiconductor laser 10 is constructed generally in accordance with conventional semiconductor laser construction techniques in which chip 14 of semiconductor material is doped to create active layer or region 16 at or near a p-N junction near upper surface 12 of chip 14. Ground electrode 18 is positioned on the bottom of chip 14 and may conveniently be connected to electrical ground. Main electrode 20 is positioned on upper surface 12 and may be connected to electrical source 22 which provides sufficient electrical bias to pump semiconductor laser 10 so that laser light beam 24 is emitted from junction front surface 26, and/or the rear surface, not shown.

The portion of semiconductor laser 10 directly beneath main electrode 20 is described herein as slave region 28 and would by itself operate as a conventional semiconductor laser. In accordance with the present invention, slave region 28 is supplemented by one or more control regions 30 and/or 32, to which inputs are applied to control laser output beam 24.

These inputs may have lower energy than the output they control, that is, semiconductor laser 10 is capable of greater than 100% intrinsic quantum efficiency and may conveniently be operated as an amplifier. The mechanism responsible for the power gain in semiconductor laser 10 results from creation of unequal saturation photon densities between the control and slave regions.

Saturation photon density may be defined as the inverse of the product of the spontaneous carrier lifetimes and the differential gain in each region. Differential gain is the derivative of gain with respect to carrier density. These quantities will be described below in greater detail with regard to equations 1 and 2.

In the embodiment of the invention shown in FIG. 1, in which the control and slave regions are contiguous portions of the same chip of semiconductor material, chip 14, the spontaneous carrier lifetimes would likely be approximately equal because spontaneous carrier lifetimes are primarily a function of the crystal structure of the material although they are also somewhat dependent on excitation levels. When the spontaneous carrier lifetimes are the same in control and slave regions, the gain mechanism may be considered to result from the difference in differential gain between the control and slave regions.

A gain mechanism resulting from unequal differential gain between the control and slave regions will be discussed immediately below with regard to semiconductor laser 10 shown in FIG. 1. An embodiment in which the spontaneous carrier lifetimes are not necessarily equal in both control and slave regions will be discussed later hereinbelow with regard to FIG. 4.

In the embodiment shown in FIG. 1, optical control region 30 is contiguous with electrical control portion 32 which is contiguous with slave region 28. The relationship between the control regions may easily be reversed so that electrical control portion 32 is contiguous with optical control region 30 which is then contiguous with slave region 28. Similarly, only one control region need be present. In the alternate embodiment discussed below with regard to FIG. 4, the control region or regions are not necessarily contiguous with the slave region.

Referring now again to FIG. 1, optical control region 30 is provided with optical input 34 which provides optical access to active region 16 in semiconductor laser 10. In a conventional semiconductor laser diode, the entire upper surface 12 may be substantially covered by an opaque, conducting layer forming main electrode 20. Optical input 34 in that case may simply be an opening in main electrode 20 through which the input light may pass. The optical access to the active layer may be provided by the manufacturing process or added later by further etching or other means for removal of a portion of main electrode 20 or other covering of upper surface 12.

Optical input 34 permits an optical connection between input light beam 36 and the portion of active layer 16 in optical control region 30 in order to control the amplitude of output beam 24 as described below. Input light beam 36 may be provided in any manner convenient for the application of semiconductor laser 10. In the embodiment shown in FIG. 1, input light beam 36 is generated by control laser 38 under the control of signal input 40. Control laser output beam 42 may be applied directly to optical input 34 as input light beam 36 in some applications, but will likely benefit from focussing by, for example, microscope objective lens system 44.

Turning now to electrical control region 32, electrical input 46 may simply be an electrical connection to upper surface 12, electrically isolated from main electrode 20. As in the case of optical input 34 described above, electrical input 46 may be provided during the manufacturing of semiconductor laser 10 or added thereafter by isolating a portion of main electrode 20 by etching or other means for removal of a portion of the opaque surface of main electrode 20.

Electrical input 46 permits the application of an additional electrical input, such as an AC input signal from signal input 48, to optical control region 30. Blocking capacitor 50 may be provided to block any DC bias from signal input 48.

Semiconductor laser 10, with either or both control regions 30 and/or 32, operates as an amplifier. DC bias above threshold is applied to slave region 28 from electrical source 22 via main electrode 20 to cause semiconductor laser 10 to lase and emit laser output beam 24. The intensity of laser output beam 24 under steady state conditions for any particular semiconductor laser configuration is a function of the bias provided by electrical source 22.

Input light beam 36 applied via optical input 34 may be used to control laser output beam 24. Electrical input 46 from signal input 48, or any other appropriate source, may be used to control laser output beam 24. These inputs may be provided singly, or in combination if both optical control region 30 and electrical control region 32 are provided in the same semiconductor laser 10. In any event, semiconductor laser 10 acts as an amplifier in that relatively large changes in laser output beam 24 may be controlled by signals of lower energy applied to optical input 34 and/or electrical input 46. That is, semiconductor laser 10 may be operated in manner providing greater than 100% differential quantum efficiency.

The operation of the invention may be better understood from the following description of an optically controlled, conventional single quantum well embodiment of semiconductor laser 10. For clarity, the term "conventional single quantum well" shall refer herein to structures which include single quantum well structures as conventionally understood. The term "quantum well" by itself shall refer to all quantum well structures including conventional single quantum wells as well as quantum dots, quantum wires and etc. In embodiment being described, laser output beam 24 may be controlled by input light beam 36 applied to optical control region 30. A 6 dB. gain has been achieved with an experimental version of semiconductor laser 10 constructed in accordance with this embodiment.

In that embodiment, semiconductor laser 10 is a GaAs semiconductor laser with a 100% conventional single quantum well in an AlGaAs graded index separate confinement heterostructure, or GRINSCH, provided with a 5 μm opening in main electrode 20 to form optical input 34. The threshold bias current is 27 mA and the lasing wavelength is 850 nm. Optical input 34 creates a small region within active region 16 in optical control region 30 which is unpumped by the bias applied through main electrode 20. This region is optically pumped by input light beam 36 at 676.4 nm which is absorbed in active region 16. When semiconductor laser 10 is biased above threshold, optical excitation of optical control region 30 controls laser output beam 24.

It is important to note that the operation of semiconductor laser 10 causes a frequency shift between the 676.4 nm input signal and the 850 nm output signal. The wavelength of input light beam 36 is selected so that it is strongly absorbed by active region 16, but easily transmitted through the semiconductor material surrounding active region 16 within chip 14.

In a preferred embodiment of the invention in which the semiconductor material utilizes a graded index separate confinement heterostructure, or GRINSCH, most of the absorption takes place in the GRINSCH region. This increases the effective absorption of input light beam 36 by the quantum well structure thereby increasing the overall gain available by increasing the value of $\eta$, the coupling efficiency discussed below with regard to equation 1.

Assuming constant spontaneous lifetimes in control and slave regions as noted above, the gain mechanism operative in semiconductor laser 10 may be considered to result from the unequal differential gains between the control and slave regions. In particular, optical control region 30 has a larger differential gain than slave region 28. The change in carrier density in optical control region 30 caused by input light beam 36 is leveraged into a large change in carrier density in slave region 28, causing a correspondingly large change in the optical power in laser output beam 24.

The gain leverage between control and slave regions may be more easily understood by modeling semiconductor laser 10 as two independent carrier populations in separate regions; a small region, optical control region 30, and a large region, slave region 28. Slave region 28 is pumped by a DC bias current from electrical source 22 while optical control region 30 is excited by an external optical source, e.g. input light beam 36, producing a relatively lower carrier density.

In a quantum well laser for example, lasing at the first sub-band edge, differential gain is a rapidly decreasing function of carrier density. As a result, differential gain $G_1'$ of optical control region 30 will be larger than differential gain $G_2'$ of slave region 28.

Figure 2:
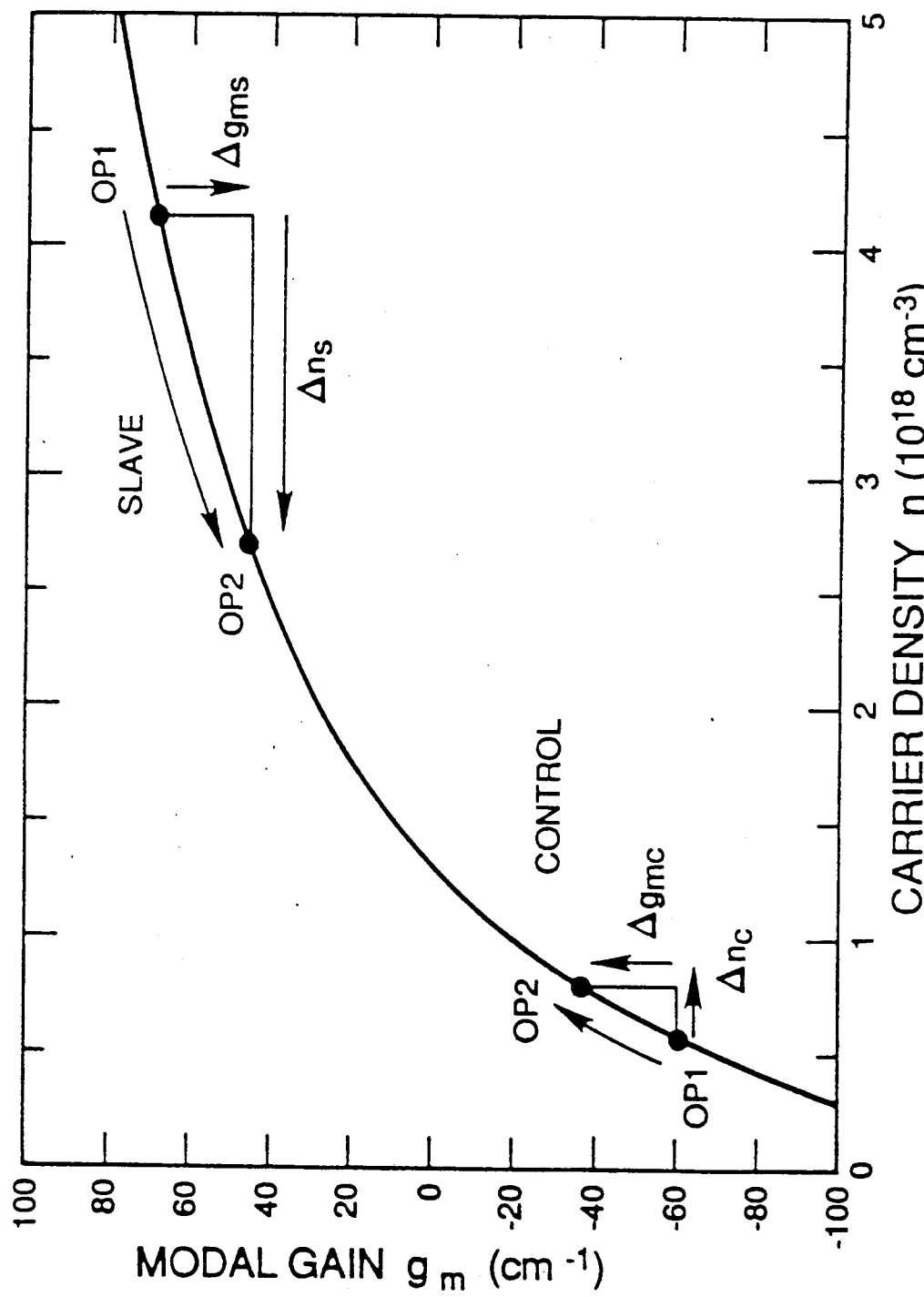
FIG. 2 shows the calculated gain curve for a preferred embodiment of semiconductor laser 10 shown in FIG. 1 as a graph of modal gain as a function of carrier density.

FIG. 2 shows the calculated gain curve for semiconductor laser 10, including optical Control region 30 and slave region 28, in a graph of modal gain as a function of carrier density. As optical control region 30 is pumped by input light beam 36 via optical input 34, the operating point for optical control region 30 moves along the gain curve from operating point 1, OP1, to operating point 2, OP2. Above threshold, an increase in control modal gain is compensated by an equal decrease in slave modal gain in accordance with the principal known as gain clamping.

Gain clamping is the known condition resulting from the balancing of loss and gain required for steady state lasing oscillation. In the present embodiment, the optical loss is constant and the optical gain is the sum of the optical gains in the slave regions and each of the control regions. In accordance with the principle of gain clamping, the sum must remain constant. Thus change in control modal gain is compensated by an opposite change in slave modal gain.

The smaller differential gain $G_2'$ in slave region 28, however, leads to a large decrease in carrier density in that region. For a fixed bias current from electrical source 22, this results in a large increase in optical output power in laser output beam 24.

The actual power gain above threshold for semiconductor laser 10 including optical control region 30 may be calculated in accordance with the following equation:

$$\frac{\Delta P_{out}}{\Delta P_{in}} = \eta \frac{(\omega_L)(G_1'\tau_1)(1 + pG_2'\tau_2)}{(\omega_p)(G_2'\tau_2)(1 + pG_1'\tau_1)} \quad (1)$$

where $\eta$ is the coupling efficiency, $\tau_1$ is the spontaneous lifetime in the slave region, $\tau_2$ is the spontaneous lifetime in the slave region, p is the photon density of the lasing mode, and $\omega_L$ and $\omega_P$ are the lasing frequencies of semiconductor laser 10 and control laser 38, respectively. It is important to note that, assuming constant spontaneous carrier lifetimes, the power gain is governed by the ratio of the differential gains in optical control region 30 and slave region 28.

The gain for an embodiment of semiconductor laser 10 including electrical control portion 32 and slave region 28 may be calculated in accordance with the following equation:

$$\frac{P_{out}}{I_{in}} = \eta' \frac{(\hbar\omega)(G_1'\tau_1)(1 + pG_2'\tau_2)}{q(G_2'\tau_2)(1 + pG_1'\tau_1)} \quad (2)$$

where $\eta'$ is the electrical coupling efficiency, $I_{in}$ is the input current, $\hbar\omega$ is the energy of the lasing photons, and q is the electronic charge. Again, assuming substantially constant spontaneous carrier lifetimes in both regions, the power gain is governed by the ratio of the differential gains in electrical control portion 32 and slave region 28.

Figure 3:
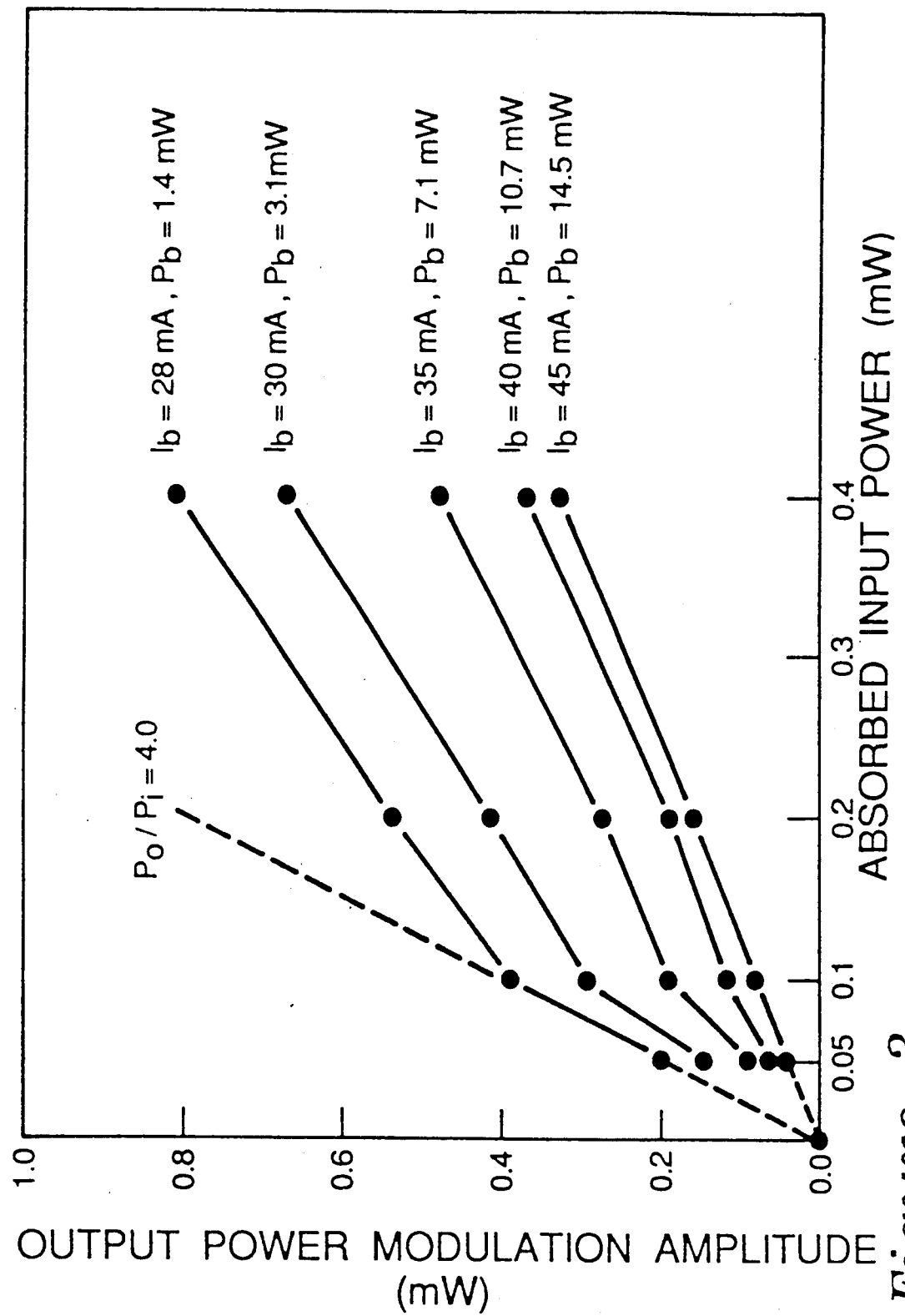
FIG. 3 shows the output power modulation amplitude as a function of absorbed optical input power at several bias current levels for the embodiment of semiconductor laser 10 operating in accordance with the graph shown in FIG. 2.

Referring now to FIG. 3, the output power modulation amplitude of laser output beam 24 is shown as a function of absorbed optical input power of input light beam 36 at several bias current levels from electrical source 22 for semiconductor laser 10. For input powers below 0.1 mW, the transfer characteristics are approximately linear and exhibit a 6 dB power gain for current levels slightly above threshold. This results in the ratio $G_1'/G_2'$ being equal to 6 dB gain assuming the spontaneous lifetimes are the same in optical control region 30 and slave region 28. As the input power or bias levels are increased, the gain is reduced in accordance with equation (1) above.

The effect of unequal spontaneous carrier lifetimes in control and slaves regions will be discussed below with regard to FIG. 4.

With regard again to semiconductor laser 10 shown in FIG. 1, higher power gains may be achieved by increasing $\eta$ by, for example, eliminating Fresnel reflection from upper surface 12 at optical input 34. Similarly, higher power gains may also be achieved by improving the differential gain ratio $G_1'/G_2'$ by, for example, operating slave region 28 at a higher excitation level and/or operating optical control region 30 at a lower excitation level.

The embodiment of semiconductor laser 10 described above utilized a quantum well extending through optical control region 30 to slave region 28. An increase in differential gain and therefore overall effective gain may be achieved by using a plurality of additional quantum well structures in optical control region 30.

An embodiment of semiconductor laser 10 using electrical control portion 32 alone, or in combination with optical control region 30, will operate in much the same manner.

Figure 4:
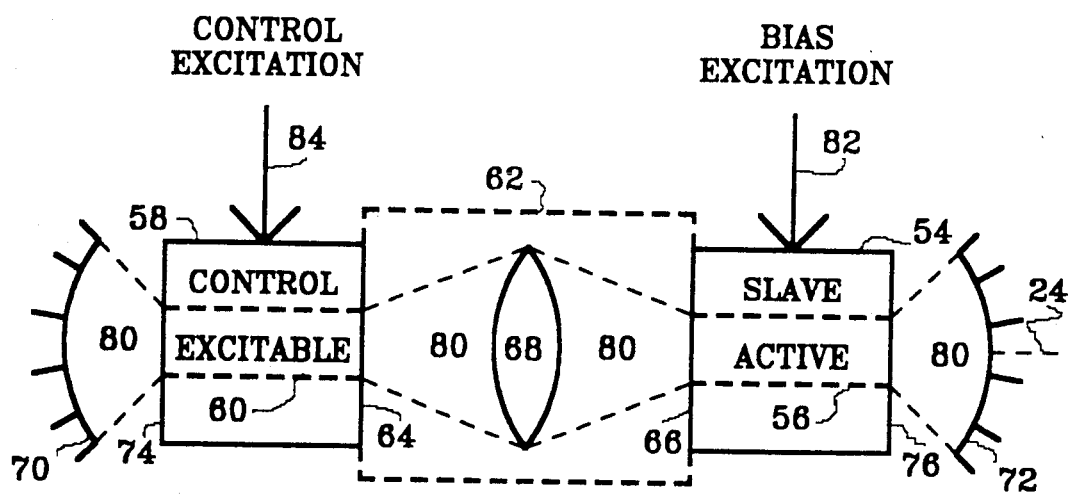
FIG. 4 is a block diagram illustration of the functional components of semiconductor laser system 52.

FIG. 4 is a block diagram illustration of the functional components of laser system 52. Semiconductor laser 10, described above and shown in FIG. 1, includes slave region 28 and at least one contiguous control region, such as optical control region 30 and/or electrical control portion 32. Laser system 52 includes control and slave regions which need not be contiguous.

Laser system 52 is configured with slave region 54, including active region 56, constructed in generally the same manner as slave region 28 shown in FIG. 1. Semiconductor laser system 52 includes control region 58 which may be similar to optical control region 30 or electrical control portion 32 shown in FIG. 1 except that active region 16 is represented by excitable region 60 as will be explained in more detail, below.

Excitable region 60 of control region 58 is optically coupled to active region 56 in slave region 54 by means of optical coupler 62. In a contiguous region design such as semiconductor laser 10 shown in FIG. 1, optical coupler 62 may be formed by the juxtaposition of the slave and active regions in chip 14.

In an embodiment in which the slave and active regions are not formed in a single chip of semiconductor material, the regions in separate chips may be made contiguous by positioning diode surface 64 of control region 58 against diode surface 66 of slave region 54. In such an embodiment, optical coupler 62 would consist of compatible non-reflective surfaces or surface coatings on diode surface 64 and diode surface 66.

As noted above, however, the slave and control regions need not be contiguous. In the general case shown in FIG. 4, slave region 54 and control region 58 may be physically separate chips of the same or different semiconductor material. Optical coupler 62 includes, in addition to non-reflective surface or surface coatings 64 and 66, a suitable optical transmission control element such as lens system 68.

In addition, cavity mirrors 70 and 72 are provided at diode surfaces 74 and 76 of control region 58 and slave region 54, respectively. Cavity mirrors 70 and 72 may be physically separate from diode surfaces 74 and 76 in which case the diode surfaces would have to be non-reflecting or have non-reflective coatings thereon. In a particular application, it may be convenient to form cavity mirrors 70 and 72 by cleaving diode surfaces 74 and 76, or by some other conventional means, to form reflective surfaces.

Cavity mirrors 70 and 72 form the boundaries of resonant cavity 80 which includes excitable region 60, active region 56 and any appropriate portions of optical coupler 62. Resonant cavity 80 of laser system 52 may be pumped by application of bias excitation 82 to active region 56 of slave region 54. The operation of laser system 52 is then controlled by control excitation 84 applied to excitable region 60 of control region 58 in the manner discussed below.

As noted above with regard to equations 1 and 2, the gain mechanism operative in semiconductor lasers according to the present invention is a function of unequal saturation photon density in the control and slave regions. Saturation photon density is inversely proportional to the product of differential gain and spontaneous carrier lifetimes. In the embodiment discussed above with reference to FIG. 1, the spontaneous carrier lifetimes were assumed to be substantially the same in both regions because the control and slave regions were formed in the same chip. In the more general case, as shown in FIG. 4, it is only necessary that the product of differential gain and spontaneous lifetimes be different in the control and slave regions.

Slave region 54 includes active region 56 which, when biased above threshold by bias excitation 82, causes lasing in resonant cavity 80. Region 56 is said to be an active region because it results in net energy added to the optical energy lasing in resonant cavity 80. However, it is possible to operate control region 58 with a region that is not necessarily active because it is only necessary that the product of differential gain and spontaneous lifetimes be different in slave and control regions.

In particular applications, it may be convenient to add net energy to the optical energy lasing in resonant cavity 80 by applying control excitation 84 to excitable region 60. In such applications, excitable region 60 would be an active region as defined above. In other applications, it may be convenient not to result in net added energy as a result of control excitation 84. Hence region 60 is termed an excitable region, that is, it may or may not be an active region as defined above.

Semiconductor laser 10 and laser system 52 may be operated in analog modes, that is, the energy in laser output beam 24 would be an amplified version of the energy applied to the control region. In other applications, it may be more desirable to operate the lasers in a digital mode in which the output power in laser output beam 24 would be switched between high and low values, in response to the presence or absence of energy applied to the appropriate control region.

In this manner, lasers according to the present invention permit the configuration of electro-optical and optical to optical components that do not require the electrical to optical conversion and/or preamplification required in circuits configured with conventional components and lasers. Conventional devices are limited to a maximum of 100% differential quantum efficiency. That is, conventional individual devices do not directly control optical output power with optical or electrical input at lower energy levels.

They do not amplify input optical or electrical power directly. Semiconductor lasers according to the present invention can control more optical power than is used as a control input to them. Such devices are capable of greater than 100% differential quantum efficiency and provide the means for amplifying input optical power directly, within a single semiconductor device or optically connected system of semiconductor devices.

The embodiment shown in FIG. 1 has two contiguous control regions, optical control region 30 and electrical control region 32, controlling the power output from semiconductor laser 10 having a single slave region, slave region 28. This configuration may easily be extended to include multiple slave regions separated by one or more control regions, as long as the required inequality of saturation photon density between the slave and control regions is maintained.

Figure 5:
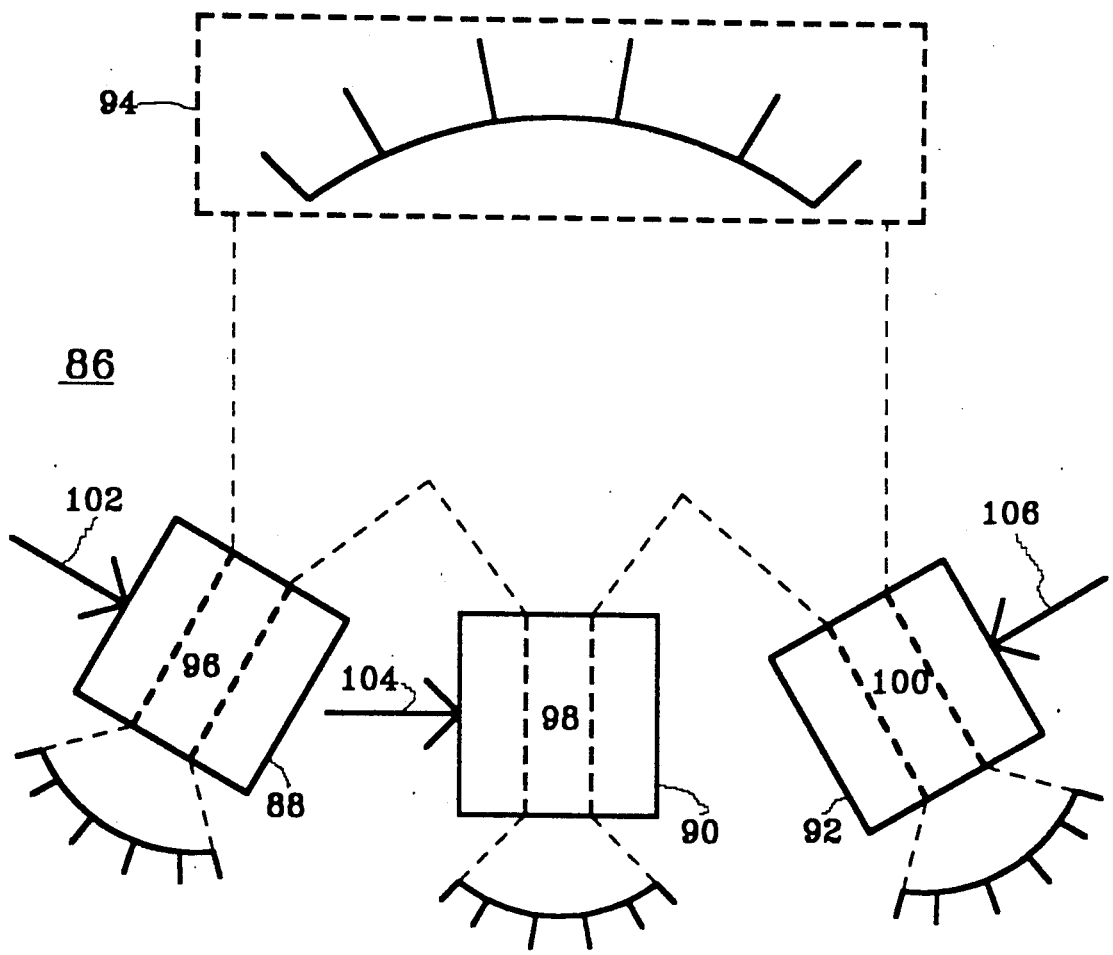
FIG. 5 is an illustration of controllable lasing component system s6 including configurable regions 88, 90 and 92 and optical path subsystem 94.

Referring now to FIG. 5, devices may be configured according to the present invention in which control regions may interact with more than one slave region and/or slave regions may be controlled by more than one control region. It is not necessary for control and slave regions to be in a straight line, or even be preconfigured as slave or control regions. FIG. 5 shows controllable lasing component system 86 including configurable regions 88, 90 and 92 and optical path subsystem 94.

Optical path subsystem 94 is controllable by conventional means, not shown, to reflect light from one or more configurable regions 88, 90 and 92 back to one or more other such configurable regions to form resonant cavities therebetween. Each configurable region 88, 90 and 92 includes active, or at least excitable, regions 96, 98 and 100 respectively therein to each of which is applied a suitable bias or control excitation signal such as signals 102, 104 and 106.

When an optical signal is routed by optical path subsystem 94 from one or more configurable regions 88, 90 and 92 to another such configurable region, both of which are biased or excited so that a resonant cavity is formed including regions of unequal saturation photon density, a semiconductor lasing device with greater than 100% quantum efficiency may be created. By varying the optical paths and saturation photon densities, complex interactive optical signal processing circuitry can easily be configured from arrays of configurable regions.

While this invention has been described with reference to its presently preferred embodiment, its scope is not limited thereto. Rather, such scope is only limited insofar as defined by the following set of claims and all equivalents thereof.

What is claimed is:

1. A controllable semiconductor laser system, comprising:

a plurality of semiconductor regions forming at least one resonant cavity;

a first semiconductor region in said plurality operating at a first differential gain;

a second semiconductor region in said plurality operating at a second differential gain, said second differential gain being sufficiently smaller than said first differential gain so that the effect on lasing of a given amount of energy applied to the first semiconductor region is substantially greater than the effect on lasing of the application of the same amount of energy to the second semiconductor region;

pumping means for applying energy to said second semiconductor region to excite lasing in said resonant cavity; and control means for applying energy to said first semiconductor region to control the lasing in said resonant cavity in response thereto.

2. The semiconductor laser claimed in claim 1, wherein said control means further comprises:

means for applying an optical input signal to said first semiconductor region.

3. The semiconductor laser claimed in claim 2, wherein said first semiconductor region includes a GRINSCH structure.

4. The semiconductor laser claimed in claim 2, wherein said control means further comprises:

means for controlling the amplitude of the lasing in said resonant cavity.

5. The semiconductor laser claimed in claim 2, wherein the control means controls changes in the energy in the lasing in response to smaller changes in the energy of the optical input signal whereby said semiconductor laser operates at a differential quantum efficiency greater than 100%.

6. The semiconductor laser claimed in claim 5, wherein said semiconductor regions include a quantum well structure.

7. The semiconductor laser claimed in claim 6, wherein said quantum well structure is a single quantum well structure.

8. The semiconductor laser claimed in claim 6 wherein said first semiconductor region includes an additional plurality of quantum well structures.

9. The semiconductor laser claimed in claim 2, wherein said means for applying an optical input signal further comprises:

an input light source; and means for focusing said input light on a portion of said first region.

10. The semiconductor laser claimed in claim 9, wherein said input light source is a laser.

11. The semiconductor laser claimed in claim 1, wherein said control means further comprises:

means for applying an electrical input signal to said first region.

12. The semiconductor laser claimed in claim 11, wherein said pumping means further comprises:

means for applying an electrical bias to said second region isolated from said electrical input signal.

13. The semiconductor laser claimed in claim 11 wherein said control means controls the amplitude of the lasing in said resonant cavity.

14. The semiconductor laser claimed in claim 11, wherein the control means controls changes in the energy of the lasing in response to smaller changes in the energy of the corresponding electrical input signal whereby said semiconductor laser operates at a differential quantum efficiency greater than 100%.

15. The semiconductor laser claimed in claim 12, wherein said semiconductor regions include a quantum well structure.

16. The semiconductor laser claimed in claim 15, wherein said quantum well structure is a single quantum well structure.

17. The semiconductor laser claimed in claim 16 wherein said first semiconductor region includes an additional plurality of quantum well structures.

18. A controllable semiconductor laser system, comprising:

a plurality of semiconductor regions forming at least one resonant cavity;

pumping means for exciting lasing in said resonant cavity;

means for controlling lasing in said resonant cavity in response to an input signal by operating at least two semiconductor regions related thereto at unequal differential gains; and additional semiconductor regions associated with said resonant cavity operating at differential gains unequal to said differential gain in at least said first or second region, to further control said lasing in said resonant cavity.

19. A controllable semiconductor laser system, comprising:

a plurality of semiconductor regions forming at least one resonant cavity, at least two of said semiconductor regions being not contiguous;

optical path means responsive to said non-contiguous regions for forming at least a portion of said resonant cavity therebetween;

pumping means for exciting lasing in said resonant cavity; and means for controlling lasing in said resonant cavity in response to an input signal by operating at least two semiconductor regions related thereto at unequal differential gains.

20. A semiconductor laser, comprising:

a semiconductor chip having a single quantum well structure;

a resonant cavity in said quantum well structure including regions of different differential gains;

means for applying pumping energy to said resonant cavity to cause lasing therein; and means for applying an input signal, isolated from said pumping energy, to said chip to control said lasing.

21. The semiconductor laser claimed in claim 20 wherein said chip includes a GRINSCH structure associated with said quantum well structure.

22. The semiconductor laser claimed in claim 20 wherein said pumping energy is applied to a region of said chip operating at a first differential gain and said input signal is applied to a region of said chip operating at a different differential gain.

23. A semiconductor laser, comprising:

a semiconductor chip having a single quantum well structure;

a resonant cavity in said quantum well structure;

a main electrode on one surface of said chip for applying electrical energy to a first region of said chip, operating at a first differential gain, to cause lasing in said resonant cavity; and means for applying an input signal isolated from said electrical energy to a second region of said chip, operating at a different differential gain, to control said lasing, said input means including an optical path through said surface to an active layer in said quantum well structure.

24. A method for controlling a semiconductor laser system, comprising:

forming at least one resonant cavity with a plurality of semiconductor regions;

exciting said resonant cavity to cause lasing therein;

causing at least two of said semiconductor regions to operate at unequal differential gains; and applying energy to the one of said semiconductor regions operating at the higher differential gain to control said lasing.

25. The method for controlling a semiconductor laser claimed in claim 24, wherein the step of applying energy further comprises:

applying an optical input signal to a first semiconductor region related to said resonant cavity.

26. The method for controlling a semiconductor laser claimed in claim 25, wherein said first semiconductor region includes a GRINSCH structure.

27. The method for controlling a semiconductor laser claimed in claim 25, wherein the step of applying an optical input signal controls the amplitude of the lasing in said resonant cavity.

28. The method for controlling a semiconductor laser claimed in claim 25, wherein the step of applying energy to the one of said semiconductor regions operating at said higher differential gain controls changes in the lasing energy in response to smaller changes in applied energy whereby the semiconductor laser operates at a differential quantum efficiency greater than 100%.

29. The method for controlling a semiconductor laser claimed in claim 28, wherein said semiconductor regions include a quantum well structure.

30. The method for controlling a semiconductor laser claimed in claim 29, wherein said quantum well structure is a single quantum well structure.

31. The method for controlling a semiconductor laser claimed in claim 29 wherein said first semiconductor region includes an additional plurality of quantum well structures.

32. The method for controlling a semiconductor laser claimed in claim 25, wherein the step of applying energy to the one of said semiconductor regions operating at said higher differential gains further comprises:

focusing light from another laser on a portion of said first region.

33. The method for controlling a semiconductor laser claimed in claim 24, wherein the step of applying energy to the one of said semiconductor regions operating at the higher differential gain further comprises:

continuously controlling the amplitude of the lasing in said resonant cavity in response to the magnitude of the applied energy.

34. A method for controlling a semiconductor laser system, comprising:

forming at least one resonant cavity with a plurality of semiconductor regions;

exciting said resonant cavity to cause lasing therein; and causing at least two of said semiconductor regions to operate at unequal differential gains to control said lasing, said step including applying light from a laser focussed on a portion of a first of said semiconductor regions and applying an electrical input signal to said first region.

35. The method for controlling a semiconductor laser claimed in claim 34, wherein the step causing unequal differential gains further comprises:

applying an electrical bias to a second region isolated from said electrical input signal.

36. The method for controlling a semiconductor laser claimed in claim 35 wehrein said electrical bias is above threshold for said second region.

37. The method for controlling a semiconductor laser claimed in claim 35 wherein the coupling efficiency of said electrical input signal is great enough so that said semiconductor laser operates at a differential quantum efficiency greater than 100%.

38. The method for controlling a semiconductor laser claimed in claim 35, wherein said semiconductor regions include a quantum well structure.

39. The method for controlling a semiconductor laser claimed in claim 38, wherein said quantum well structure is a single quantum well structure.

40. The method for controlling a semiconductor laser claimed in claim 35 wherein said first semiconductor region includes an additional plurality of quantum well structures.

41. A method for controlling a semiconductor laser system, comprising:

forming at least one resonant cavity with a plurality of semiconductor regions;

exciting said resonant cavity to cause lasing therein;

causing at least two of said semiconductor regions to operate at unequal differential gains to control said lasing; and operating additional semiconductor regions associated with said resonant cavity at differential gains unequal to said differential gain in at least said first or second region, to further control said lasing in said resonant cavity.

42. A method for controlling a semiconductor laser system, comprising:

forming at least one resonant cavity with a plurality of semiconductor regions, wherein at least two of said semiconductor regions are not contiguous, and at least a portion of said resonant cavity is formed with said non-contiguous regions;

exciting said resonant cavity to cause lasing therein; and causing at least two of said semiconductor regions to operate at unequal differential gains to control said lasing.

* * * * *

UNITED STATES PATENT AND TRADEMARK OFFICE
CERTIFICATE OF CORRECTION

PATENT NO. : 5,056,100

DATED : Oct. 8, 1991

INVENTOR(S) : Vahala & Newkirk

It is certified that error appears in the above-identified patent and that said Letters Patent is hereby corrected as shown below:

| | | |
|---|---|---|
| COL. 2 | LINE 15 | Delete "s6" insert -- 86 --; |
| COL. 2 | LINE 27 | Replace "p-N" with -- P-N --; |
| COL. 4 | LINE 31 | Delete " % " insert -- Å --; |
| COL. 5 | LINE 18 | Replace "Control" with --control--; |
| COL. 5 | LINE 64 | Replace "(hω)" with --$\bar{h}\omega$--; |
| COL. 7 | LINE 5 | Delete "$8" insert --58--; |
| COL. 7 | LINE 24 | Delete "so" insert --80--; |
| COL. 8 | LINE 47 | Replace ""Which" with --which--; |
| COL. 12 | LINE 17 | Correct "wehrein" with --wherein--. |

Signed and Sealed this

Twenty-third Day of March, 1993

Attest:

STEPHEN G. KUNIN

Attesting Officer     Acting Commissioner of Patents and Trademarks